US010291202B2

(12) United States Patent
Yamada et al.

(10) Patent No.: US 10,291,202 B2
(45) Date of Patent: May 14, 2019

(54) VIBRATION DEVICE AND MANUFACTURING METHOD OF THE SAME

(71) Applicant: Murata Manufacturing Co., Ltd., Nagaokakyo-shi, Kyoto-fu (JP)

(72) Inventors: Hiroshi Yamada, Nagaokakyo (JP); Keiichi Umeda, Nagaokakyo (JP); Takehiko Kishi, Nagaokakyo (JP); Toshio Nishimura, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 606 days.

(21) Appl. No.: 15/072,610

(22) Filed: Mar. 17, 2016

(65) Prior Publication Data

US 2016/0197597 A1 Jul. 7, 2016

Related U.S. Application Data

(63) Continuation of application No. PCT/JP2014/074131, filed on Sep. 11, 2014.

(30) Foreign Application Priority Data

Sep. 20, 2013 (JP) ................................. 2013-195502

(51) Int. Cl.

| | |
|---|---|
| ***H03H 9/17*** | (2006.01) |
| ***H03H 3/007*** | (2006.01) |
| ***H03H 9/02*** | (2006.01) |
| ***H03H 9/24*** | (2006.01) |
| ***H03H 3/02*** | (2006.01) |

(52) U.S. Cl.

CPC .......... *H03H 9/171* (2013.01); *H03H 3/0072* (2013.01); *H03H 3/02* (2013.01); *H03H 9/02448* (2013.01); *H03H 9/2484* (2013.01); *H03H 9/2489* (2013.01); *H03H 2003/027* (2013.01); *H03H 2009/02503* (2013.01); *H03H 2009/02511* (2013.01); *H03H 2009/241* (2013.01)

(58) Field of Classification Search

CPC .... H03H 9/17; H03H 9/02448; H03H 9/2484; H03H 9/2489; H03H 3/0072

See application file for complete search history.

(56) References Cited

U.S. PATENT DOCUMENTS 4,358,745 A 11/1982 Keyes
4,764,244 A * 8/1988 Chitty ................. H03H 3/0072 216/20

(Continued)

FOREIGN PATENT DOCUMENTS

JP 57-162513 A 10/1982
JP 2009005024 A 1/2009

(Continued)

OTHER PUBLICATIONS

International Search Report for PCT/JP2014/074131 dated Nov. 18, 2014.

(Continued)

*Primary Examiner* — J. San Martin
(74) *Attorney, Agent, or Firm* — Arent Fox LLP

(57) ABSTRACT

A vibration device that includes a support member, vibration arms connected to the support member and each having an n-type Si layer which is a degenerate semiconductor, and electrodes provided so as to excite the vibration arms, and silicon oxide films containing impurities in contact with a respective lower surface of the n-type Si layers of each vibration arm.

19 Claims, 9 Drawing Sheets

(56) References Cited

U.S. PATENT DOCUMENTS

| | | | | |
|---|---|---|---|---|
| 7,561,009 | B2 | 7/2009 | Larson, III et al. | |
| 8,098,002 | B2 | 1/2012 | Baborowski et al. | |
| 2009/0302716 | A1 | 12/2009 | Ohara et al. | |
| 2010/0013360 | A1 | 1/2010 | Baborowski et al. | |
| 2010/0176898 | A1 | 7/2010 | Kihara | |
| 2011/0127625 | A1* | 6/2011 | van der Avoort | H03H 3/0076 257/418 |
| 2013/0099630 | A1* | 4/2013 | Matsuda | H03H 9/02102 310/346 |
| 2014/0118092 | A1* | 5/2014 | Burak | H03H 9/132 333/187 |
| 2014/0225682 | A1* | 8/2014 | Burak | H03H 9/0211 333/187 |
| 2015/0180449 | A1* | 6/2015 | Umeda | H03H 3/0072 310/370 |
| 2016/0329877 | A1* | 11/2016 | Nishimura | H03H 9/2489 |
| 2017/0272050 | A1* | 9/2017 | Umeda | B81B 3/00 |
| 2018/0175794 | A1* | 6/2018 | Yamazaki | H03H 3/0072 |
| 2018/0191329 | A1* | 7/2018 | Nishimura | H03H 9/02433 |
| 2018/0205363 | A1* | 7/2018 | Hirota | H03H 9/0595 |
| 2018/0212139 | A1* | 7/2018 | Hirota | H03H 9/02433 |
| 2018/0226937 | A1* | 8/2018 | Umeda | H03H 3/0077 |

FOREIGN PATENT DOCUMENTS

| | | | |
|---|---|---|---|
| JP | 2009302661 | A | 12/2009 |
| JP | 2010166201 | A | 7/2010 |

OTHER PUBLICATIONS

Written Opinion for PCT/JP2014/074131 dated Nov. 18, 2014.

Jaakkola A, et al.; "Temperature Compensated Resonance Modes of Degenerately n-doped Silicon MEMS Resonators"; Frequency Control Symposium (FCS), 2012, pp. 1-5.

* cited by examiner

VIBRATION DEVICE AND MANUFACTURING METHOD OF THE SAME

CROSS REFERENCE TO RELATED APPLICATIONS

The present application is a continuation of International application No. PCT/JP2014/074131, filed Sep. 11, 2014, which claims priority to Japanese Patent Application No. 2013-195502, filed Sep. 20, 2013, the entire contents of each of which are incorporated herein by reference.

FIELD OF THE INVENTION

The present invention relates to a vibration device in which a vibration arm is connected to a support member and a manufacturing method of the stated vibration device.

BACKGROUND OF THE INVENTION

A MEMS (Micro Electro Mechanical Systems) structure in which an excitation section including a piezoelectric thin film is formed on a Si semiconductor layer has been known. For example, Patent Document 1 cited below discloses a vibration device in which each one end of a plurality of vibration arms is connected to a support member. In this vibration device, the vibration arms each include a Si semiconductor layer. A $SiO_2$ film is provided on the Si semiconductor layer. On the $SiO_2$ film, a first electrode, a piezoelectric thin film, and a second electrode are laminated in that order. In other words, an excitation section including the piezoelectric thin film is formed on the Si semiconductor layer.

The vibration device disclosed in Patent Document 1 is a vibration device making use of bulk waves. Further, the vibration device disclosed in Patent Document 1 includes a relatively thick $SiO_2$ film of no less than 2 μm in order to improve temperature characteristics.

Meanwhile, Patent Document 2 cited below discloses a surface acoustic wave semiconductor device using an n-type Si substrate doped with phosphorus (hereinafter, referred to as "P"). It is described therein that using the n-type Si substrate doped with P makes it possible to change an elastic constant, a velocity of the surface acoustic wave, and the like, and improve temperature characteristics.

Patent Document 2: U.S. Pat. No. 8,098,002

Patent Document 3: Japanese Unexamined Patent Application Publication No. 57-162513

SUMMARY OF THE INVENTION

In the vibration device making use of bulk waves disclosed in Patent Document 1, it is necessary to provide a relatively thick $SiO_2$ film of no less than 2 μm in order to improve the temperature characteristics as discussed above. Patent Document 1 discloses that the $SiO_2$ film is formed by a thermal oxidation method. However, in the case where the thermal oxidation method is used, a growth rate of the $SiO_2$ film becomes significantly slow when the $SiO_2$ film is deposited while a thickness of the film is kept longer than a constant value. This makes it difficult to form a $SiO_2$ film with a thickness of 2 μm or more.

On the other hand, a thick $SiO_2$ film can be easily formed by a sputtering method, a CVD method, or the like. However, a film mechanical loss Qm of a $SiO_2$ film formed by these methods is unfavorable, which raises a problem that a Q-value of the vibrator is degraded.

Further, processing of bonding for constituting the MEMS structure is generally carried out by thermal bonding. As such, in the n-type Si substrate that is doped with P as disclosed in Patent Document 2, P is scattered into the air or moved to other members from a surface of the n-type Si substrate by heat generated during the thermal bonding in some case. In other words, the concentration of P is non-uniform in the n-type Si substrate. Because of this, even if an n-type Si substrate doped with P is used in a vibration device having the MEMS structure, there is a case in which a variation in the resonant frequency of the vibration device is generated due to a change in temperature.

An object of the present invention is to provide a vibration device capable of suppressing a variation in a resonant frequency due to a change in temperature, and a manufacturing method thereof.

A vibration device according to the present invention includes a support member, a vibration body connected to the support member and having an n-type Si layer which is a degenerate semiconductor, and an electrode provided so as to excite the vibration body, where a silicon oxide film containing impurities is so provided as to be in contact with a lower surface of the n-type Si layer.

In a specific aspect of the vibration device according to the present invention, the vibration device further includes a silicon oxide film that contains impurities and is so provided as to be in contact with an upper surface of the above n-type Si layer.

In another specific aspect of the vibration device according to the present invention, the vibration device further includes a piezoelectric thin film, the above-mentioned electrode includes a first electrode and a second electrode, the piezoelectric thin film is so disposed as to be sandwiched between the first and second electrodes, and an excitation section formed of the above piezoelectric thin film and the first and second electrodes is provided on the n-type Si layer.

In another specific aspect of the vibration device according to the present invention, the vibration device further includes a piezoelectric thin film, and the stated piezoelectric thin film is so disposed as to be sandwiched between the electrode and an upper portion of the n-type Si layer.

In still another specific aspect of the vibration device according to the present invention, the above-mentioned silicon oxide film is a film formed by a thermal oxidation method.

In another specific aspect of the vibration device according to the present invention, the above-mentioned impurities are a dopant doped in the n-type Si layer.

In another specific aspect of the vibration device according to the present invention, the n-type Si layer which is a degenerate semiconductor is an n-type Si layer with a doping concentration of no less than $1\times10^{19}/cm^3$.

In another specific aspect of the vibration device according to the present invention, the dopant in the n-type Si layer which is a degenerate semiconductor is P.

In another specific aspect of the vibration device according to the present invention, the above-mentioned excitation section is so configured as to cause the vibration body to perform flexural vibration.

In another specific aspect of the vibration device according to the present invention, the vibration device includes odd numbers of the vibration bodies, and the excitation section is so configured as to cause the stated vibration bodies to perform out-of-plane flexural vibration.

In another specific aspect of the vibration device according to the present invention, the vibration device includes even numbers of the vibration bodies, and the excitation section is so configured as to cause the stated vibration bodies to perform in-plane flexural vibration.

In still another broad aspect of the present invention, a manufacturing method of the vibration device according to the present invention is provided. The manufacturing method according to the present invention includes processing of preparing a vibration body that is connected to a support member and has an n-type Si layer, on upper and lower surfaces of which silicon oxide films containing impurities are provided, and processing of forming an electrode that is so provided as to excite the vibration body.

In a specific aspect of the manufacturing method of the vibration device according to the present invention, the method further includes processing of forming a piezoelectric thin film, and the stated piezoelectric thin film is so provided as to be sandwiched between the first and second electrodes.

In another specific aspect of the manufacturing method of the vibration device according to the present invention, the method further includes processing of forming a piezoelectric thin film, and the stated piezoelectric thin film is so provided as to be sandwiched between the electrode and the n-type Si layer.

In another specific aspect of the manufacturing method of the vibration device according to the present invention, the processing of preparing the vibration body that is connected to the support member and has the n-type Si layer, on the upper and lower surfaces of which the silicon oxide films containing impurities are provided, includes: processing of preparing a support substrate that is made of Si and has a recess in a surface thereof; processing of preparing the n-type Si layer, on the upper and lower surfaces of which the silicon oxide films containing impurities are provided; and processing of laminating the n-type Si layer on which the silicon oxide films are provided so as to cover the recess of the support substrate.

In still another specific aspect of the manufacturing method of the vibration device according to the present invention, the processing of preparing the n-type Si layer, on the upper and lower surfaces of which the silicon oxide films containing impurities are provided, is processing of forming the silicon oxide films containing impurities by a thermal oxidation method.

In the vibration device according to the present invention, silicon oxide films containing impurities are so provided as to be in contact with upper and lower surfaces of an n-type Si layer which is a degenerate semiconductor. As such, because the dopant in the n-type Si layer is unlikely to be scattered to the exterior, a variation in a resonant frequency due to a change in temperature can be suppressed.

In addition, according to the manufacturing method of the vibration device according to the present invention, such a vibration device is provided that is capable of suppressing a variation in the resonant frequency due to a change in temperature.

DETAILED DESCRIPTION OF THE PREFERRED EMBODIMENTS

Hereinafter, specific embodiments of the present invention will be described with reference to the drawings, thereby clarifying the present invention.

First Embodiment

Figure 1:
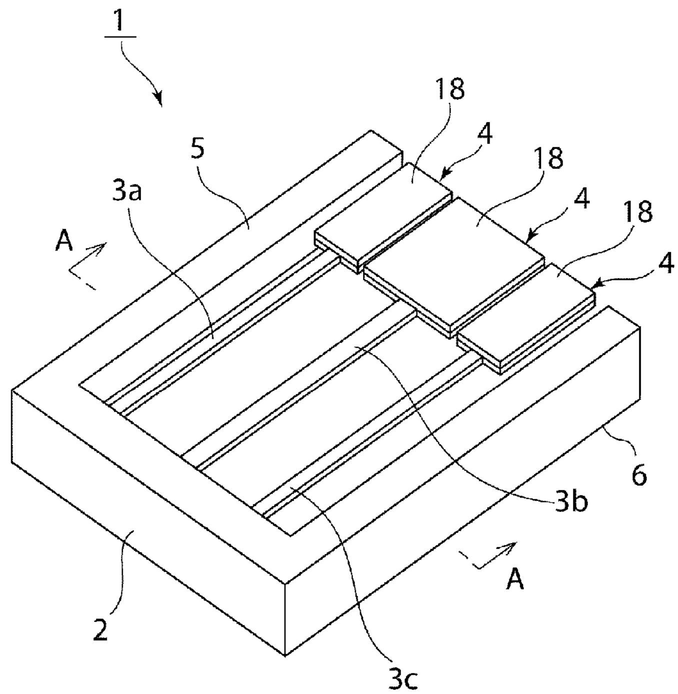
FIG. 1 is a perspective view illustrating an external appearance of a vibration device according to a first embodiment of the present invention.

FIG. 1 is a perspective view illustrating an external appearance of a vibration device 1 according to a first embodiment of the present invention. The vibration device 1 is a resonance type vibrator including a support member 2, vibration arms 3*a* through 3*c* as odd numbers of vibration bodies, and mass addition members 4. Each one end of the vibration arms 3*a* through 3*c* is connected to the support member 2. At the other ends of the vibration arms 3*a* through 3*c*, there are provided the mass addition members 4.

The vibration arms 3*a* through 3*c* are each formed in an elongate rectangle shape in plan view and have a lengthwise direction side and a width direction side. Each one end of the vibration arms 3*a* through 3*c* is connected, as a fixed end, to the support member 2, and the other end thereof is capable of being displaced as a free end. In other words, the vibration arms 3*a* through 3*c* are supported by the support member 2 in a cantilever manner. The odd numbers of vibration arms 3*a* through 3*c* are extended parallel to one another and have the same length. The vibration arms 3*a* through 3*c* are vibration bodies configured to perform flexural vibration in an out-of-plane flexural vibration mode when an alternating electric field is applied thereto.

The support member 2 is connected to each shorter side of the vibration arms 3*a* through 3*c* and extends in the width direction of the vibration arms 3*a* through 3*c*. Side frames 5 and 6 are connected to both ends of the support member 2 so as to extend in parallel with the vibration arms 3*a* through 3*c*. The support member 2 and the side frames 5, 6 are integrally formed.

The mass addition members 4 are provided at each leading end of the vibration arms 3_a_ through 3_c_. In the present embodiment, the mass addition members 4 are each formed in a rectangular plate-like shape whose dimension in the width direction is larger than that of the vibration arms 3_a_ through 3_c_.

Figure 2:
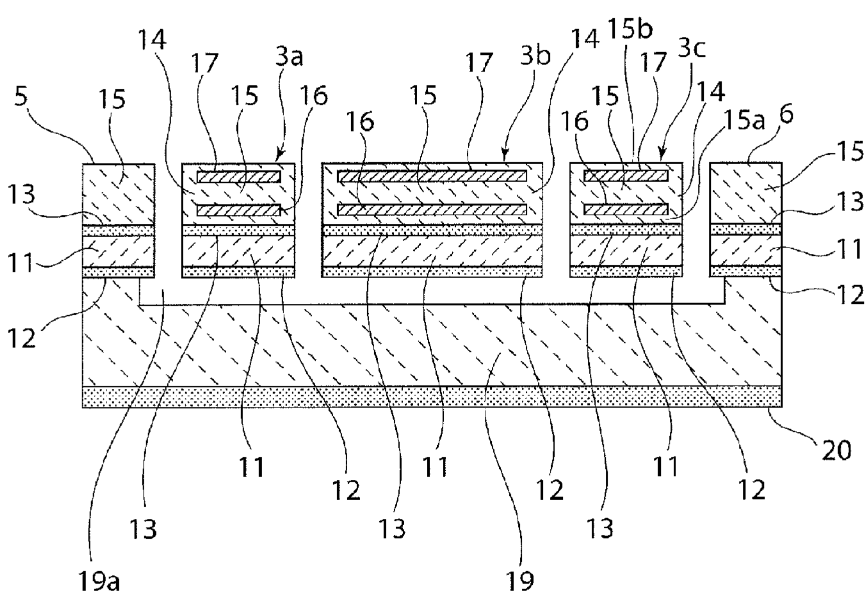
FIG. 2 is a cross-sectional view of a portion taken along an A-A line in FIG. 1.

FIG. 2 is a cross-sectional view of a portion taken along an A-A line in FIG. 1. As shown in FIG. 2, the vibration arms 3_a_ through 3_c_ are each formed of a $SiO_2$ film (silicon oxide film) 12, an n-type Si layer 11, a $SiO_2$ film 13, and an excitation section 14.

The n-type Si layer 11 is made of an n-type Si semiconductor which is a degenerate semiconductor. The n-type Si layer 11 is provided to suppress a variation in frequency due to a change in temperature. It is preferable for a doping concentration of an n-type dopant in the n-type Si layer 11 to be no less than $1\times10^{19}/cm^3$. As the n-type dopant, a Group 15 element such as P, As, or Sb can be cited. As discussed above, by Si within the n-type Si layer 11 being doped with the n-type dopant, a variation in the resonant frequency due to a change in temperature can be suppressed. This is because elastic characteristics of Si are largely affected by the carrier concentration of Si. Note that in the n-type Si layer 11, temperature characteristics can be improved without degradation of the Q-value.

In the present invention, the $SiO_2$ film 12 is provided on a lower surface of the n-type Si layer 11, and the $SiO_2$ film 13 is also provided on an upper surface thereof. The $SiO_2$ films 12 and 13 are provided in order to suppress a variation in the resonant frequency due to a change in temperature as will be explained later. In the present embodiment, although the $SiO_2$ films 12 and 13 are provided on the upper and lower surfaces of the n-type Si layer 11, the SiO2 films 12 and 13 may be so provided as to cover the perimeter of the n-type Si layer 11.

The $SiO_2$ films 12 and 13 contain impurities. It is desirable for the stated impurities to be a dopant doped in the n-type Si layer. It is preferable for the doping concentration of the n-type dopant to be no less than $1\times10^{17}/cm^3$. In this case, because the elastic characteristics of $SiO_2$ are affected by the impurities contained in the $SiO_2$, a variation in the resonant frequency due to a change in temperature can be more surely suppressed.

The excitation section 14 is provided on the upper surface of the $SiO_2$ film 13. The excitation section 14 includes a piezoelectric thin film 15, a first electrode 16, and a second electrode 17. The first electrode 16 and the second electrode 17 are so provided as to sandwich the piezoelectric thin film 15. A piezoelectric thin film 15_a_ is provided on the upper surface of the $SiO_2$ film 13, and a piezoelectric thin film 15_b_ is provided on the upper surface of the piezoelectric thin film 15 and the upper surface of the second electrode 17. The piezoelectric thin film 15_a_ is a seed layer and the piezoelectric thin film 15_b_ is a protection layer, and none of them constitute the excitation section 14. The piezoelectric thin films 15_a_, 15_b_ may not be provided.

A piezoelectric material for forming the piezoelectric thin film 15 is not limited to any specific one, and ZnO, AlN, PZT, KNN, or the like can be used. Since it is preferable for the Q-value to be high in a vibration device making use of bulk waves, ScAlN is preferably used. It is more preferable to use Sc-substitution AlN (ScAlN). The reason for this is as follows: that is, by using ScAlN, a relative band of a resonance type vibrator is widened, whereby an oscillation frequency adjustment range is further widened. Note that in the Sc-substitution AlN film (ScAlN), it is desirable for the Sc concentration to be approximately 0.5 at % to 50 at % when the atom concentration of Sc and Al is set to be 100 at %.

The first and second electrodes 16 and 17 can be formed using an appropriate metal such as Mo, Ru, Pt, Ti, Cr, Al, Cu, Ag, or an alloy of these metals.

The piezoelectric thin film 15 is polarized in a thickness direction thereof. Accordingly, by applying an alternating electric field between the first and second electrodes 16 and 17, the excitation section 14 is excited by the piezoelectric effect. As a result, the vibration arms 3_a_ through 3_c_ perform flexure vibration so as to take vibrating postures as shown in FIGS. 3(_a_) and 3(_b_).

Figure 3A:
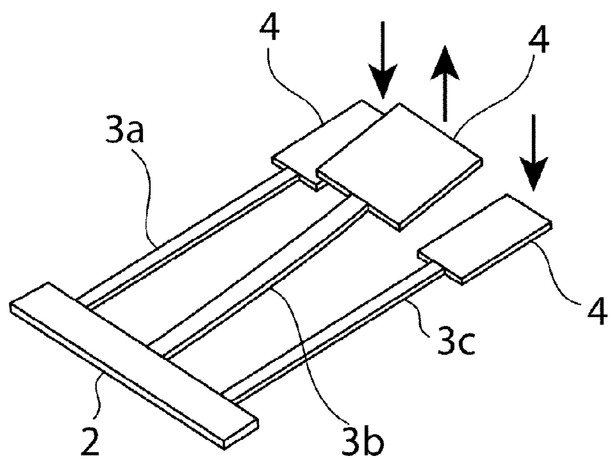
FIG. 3(*a*) and FIG. 3(*b*) are schematic perspective views for explaining vibrating postures of the vibration device according to the first embodiment of the present invention.
Figure 3B:
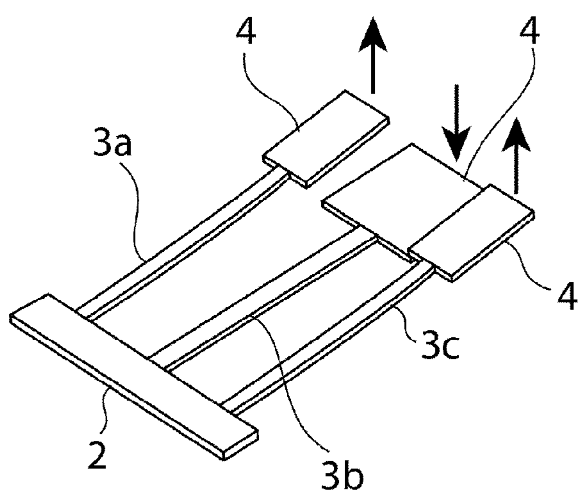

As is clear from FIGS. 3(_a_) and 3(_b_), the vibration arm 3_b_ at the center and the vibration arms 3_a_, 3_c_ at both sides are displaced in opposite phases to each other. This can be realized by causing the phase of an alternating electric field applied to the vibration arm 3_b_ at the center to be reversed relative to the phase of an alternating electric field applied to the vibration arms 3_a_ and 3_c_ at both the sides. Alternatively, the polarization direction of the piezoelectric thin film 15 in the vibration arm 3_b_ at the center may be set to be opposite to the polarization direction of the piezoelectric thin films 15 in the vibration arms 3_a_ and 3_c_ at both the sides.

The side frames 5 and 6 are formed of a $SiO_2$ film 20, a Si substrate 19, the $SiO_2$ film 12, the n-type Si layer 11, the $SiO_2$ film 13, and the piezoelectric thin film 15. The support member 2 is formed in the same manner as the side frames 5 and 6. A recess 19_a_ is formed in an upper surface of the Si substrate 19, and part of side walls of the recess 19_a_ constitute the support member 2 and the side frames 5, 6. The vibration arms 3_a_ through 3_c_ are disposed on the recess 19_a_. The Si substrate 19 is a support substrate constituting the support member 2 and the side frames 5, 6. The $SiO_2$ film 20 is a protection film and is provided on a lower surface of the Si substrate 19.

The mass addition members 4, as is clear from a manufacturing process to be explained later, have a laminated structure formed of the $SiO_2$ film 12, the n-type Si layer 11, the $SiO_2$ film 13, and the piezoelectric thin film 15, like the side frames 5 and 6. Accordingly, it is desirable for mass addition films 18 to be provided only on the upper surface side of the mass addition members 4 like in this embodiment. In addition, since the mass addition members 4 are members having a function to add mass to each leading end of the vibration arms 3_a_ through 3_c_, in the case where the mass addition members 4 have a larger dimension in the width direction than the corresponding vibration arms 3_a_ through 3_c_ as discussed before, the above-mentioned function is provided. Therefore, it is not absolutely necessary for the mass addition films 18 to be provided.

Figure 4:
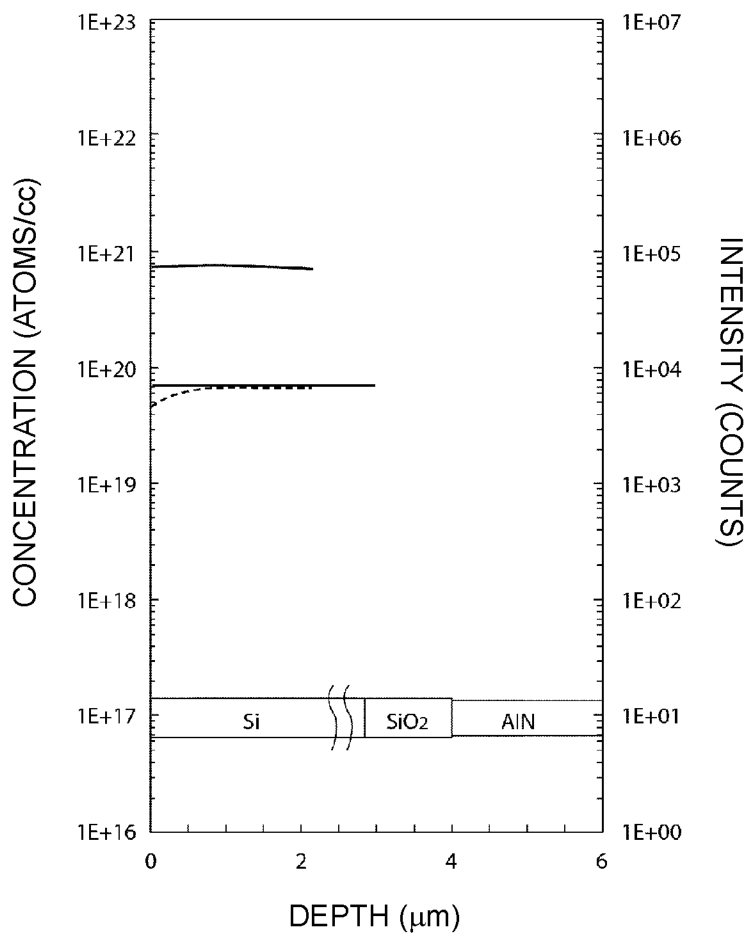
FIG. 4 is a SIMS profile illustrating concentration distribution of P in an n-type Si layer.
Figure 5A:
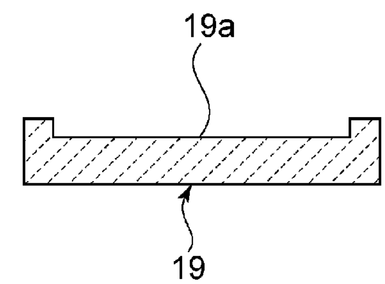
FIGS. 5(*a*) through 5(*d*) are cross-sectional views for explaining a manufacturing method of the vibration device according to the first embodiment of the present invention.
Figure 5B:
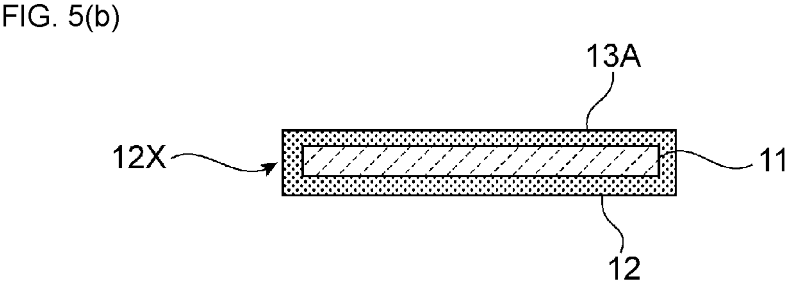
Figure 5C:
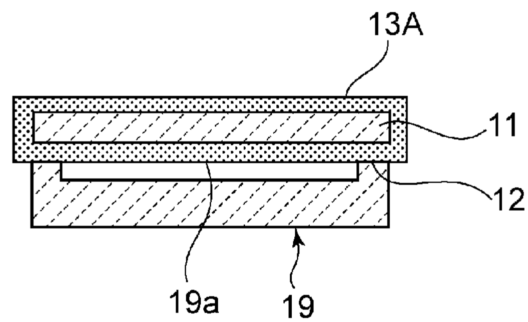
Figure 5D:
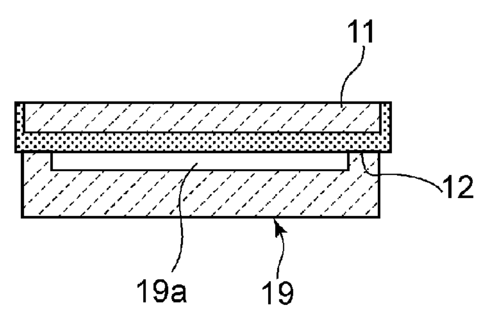
Figure 6A:
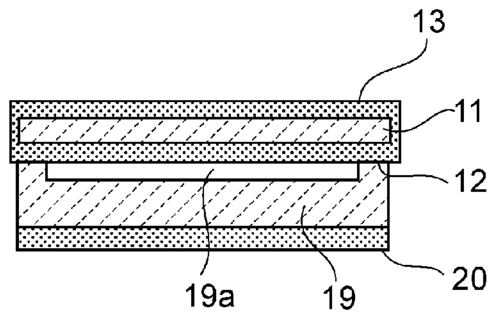
FIGS. 6(*a*) through 6(*d*) are also cross-sectional views for explaining the manufacturing method of the vibration device according to the first embodiment of the present invention.
Figure 6B:
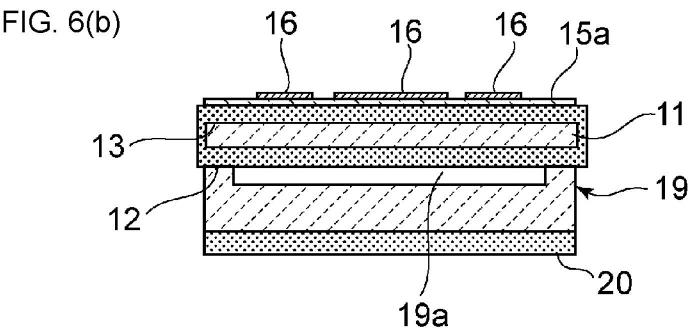
Figure 6C:
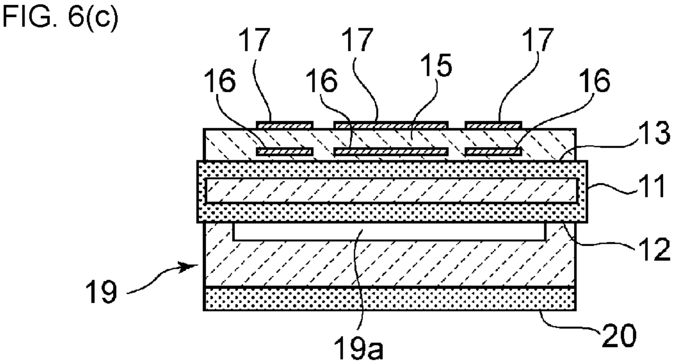
Figure 6D:
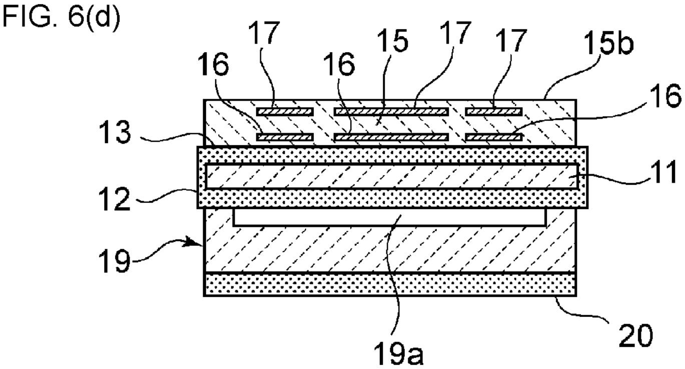

FIG. 4 is a SIMS profile illustrating the concentration distribution of P within the n-type Si layer 11. That is, it is a profile in which a change in the concentration of P is measured in a depth direction from the surface of the n-type Si layer 11. In FIG. 4, "1E+n" means $1\times10^n$. A broken line in the drawing indicates a profile in the case where the $SiO_2$ films 12, 13 are not provided on the n-type Si layer 11. In this case, it can be observed that the concentration of P becomes lower as the depth comes closer to the vicinity of the surface. Meanwhile, a solid line in the drawing indicates a profile of a case in which the $SiO_2$ films 12 and 13 are so provided as to be in contact with the n-type Si layer 11. In this case, it can be understood from the drawing that the concentration of P is uniform ranging from the surface to the inner side.

The reason why the concentration of P varies near the surface of the n-type Si layer 11 in the manner discussed above depending on whether or not the $SiO_2$ films 12, 13 are present will be described below.

The n-type Si layer 11 is bonded to the Si substrate 19 by thermal bonding as described in a manufacturing method to be explained later. Due to heat generated in the thermal bonding, P is scattered into the air from the surface of the n-type Si layer 11, or is moved to the Si substrate 19. Because of this, the concentration of P near the surface is reduced in the n-type Si layer 11 on which the $SiO_2$ films 12, 13 are not provided.

On the contrary, in the case where the $SiO_2$ films 12 and 13 are so provided as to be in contact with the n-type Si layer 11, P is suppressed by the $SiO_2$ films 12 and 13 from being scattered to the exterior. In this case, a variation in frequency due to a change in temperature is suppressed because the concentration of P is prevented from being nonuniform within the n-type Si layer 11.

(Manufacturing Method)

Although a manufacturing method of the vibration device 1 is not limited to any specific one, an example thereof will be described hereinafter with reference to FIGS. 5(*a*) through 5(*d*) and FIGS. 6(*a*) through 6(*d*).

First, as shown in FIG. 5(*a*), the Si substrate 19 is prepared. The recess 19*a* is formed in the upper surface of the Si substrate 19 by etching. It is sufficient for a depth of the recess 19*a* to be approximately 10 μm to 30 μm.

Next, as shown in FIG. 5(*b*), the n-type Si layer 11 doped with P at a doping concentration of no less than $1\times10^{19}/cm^3$ is prepared, and a $SiO_2$ film 12X containing a dopant with which the n-type Si layer is doped is formed so as to cover the perimeter of the n-type Si layer 11. Hereinafter, description in which an upper surface of the $SiO_2$ film 12X is taken as a $SiO_2$ film 13A and a lower surface thereof is taken as the $SiO_2$ film 12 will be given. The $SiO_2$ films 12 and 13A are formed by the thermal oxidation method. The $SiO_2$ films formed by the thermal oxidation method are preferable because Q-values are unlikely to degrade. A thickness of each of the $SiO_2$ films 12 and 13A is set to be 0.5 μm.

Next, as shown in FIG. 5(*c*), the n-type Si layer 11 on which the $SiO_2$ films 12 and 13A are formed is laminated on the Si substrate 19. At the time of lamination, the $SiO_2$ film 12 is made to be in contact with a surface of the Si substrate 19 on a side where the recess 19*a* of the Si substrate 19 is provided. The bonding in this case is carried out by thermal bonding at a high temperature of no less than 1100° C.

Next, as shown in FIG. 5(*d*), the $SiO_2$ film 13A is removed and the thickness of the n-type Si layer 11 is made thinner by polishing. By doing so, the thickness of the n-type Si layer 11 is set to be approximately 10 μm.

Next, as shown in FIG. 6(*a*), by the thermal oxidation method, the $SiO_2$ film 13 is formed on the upper surface of the n-type Si layer 11 and the $SiO_2$ film 20 is formed on the lower surface of the Si substrate 19. A thickness of the $SiO_2$ film 13 is set to be 0.5 μm.

Subsequently, as shown in FIG. 6(*b*), the piezoelectric thin film 15*a* made of AlN is formed with a thickness of approximately 30 nm to 100 nm on the upper surface of the $SiO_2$ film 13, and thereafter the first electrode 16 is formed on the upper surface of the piezoelectric thin film 15*a*. The first electrode 16 is a laminated electrode in which a first layer made of Mo and a second layer made of Al are laminated.

The piezoelectric thin film 15*a* is a seed layer, and the first layer made of Mo in the first electrode 16 is formed having a high orientation because of the piezoelectric thin film 15*a* being provided. Then, as shown in FIG. 6(*c*), the piezoelectric thin film 15 made of AlN is formed on the upper surface of the piezoelectric thin film 15*a* and the upper surface of the first electrode 16, and thereafter the second electrode 17 is formed on the upper surface of the piezoelectric thin film 15. The second electrode 17 is a laminated electrode in which a first layer made of Mo and a second layer made of Al are laminated. The first electrode 16 and the second electrode 17 are formed through a lift-off process using a sputtering method, for example.

Thereafter, as shown in FIG. 6(*d*), the piezoelectric thin film 15*b* made of AlN is formed with a thickness of approximately 30 nm to 100 nm on the upper surface of the piezoelectric thin film 15 and the upper surface of the second electrode 17. Then, the mass addition film 18 made of Au is formed in an area which is located on the upper surface of the piezoelectric thin film 15 where the mass addition member 4 is formed.

Finally, a process of dry etching or wet etching is carried out so that the plurality of vibration arms 3*a* through 3*c* and the mass addition members 4 shown in FIG. 1 are allowed to remain. Through this, the vibration device 1 can be obtained.

Second Embodiment

Figure 7:
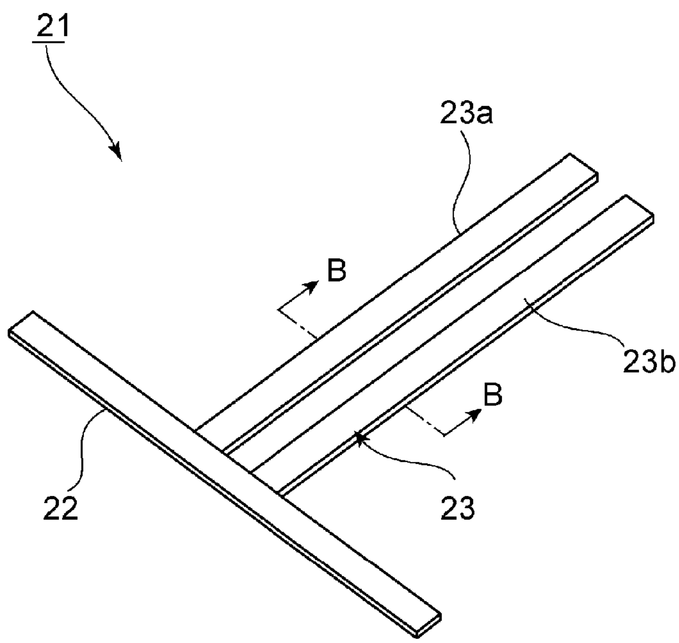
FIG. 7 is a perspective view illustrating an external appearance of a vibration device according to a second embodiment of the present invention.

The vibration device 1 according to the first embodiment of the present invention is a resonance vibrator making use of out-of-plane flexural vibrations; however, the vibration device may be a resonance vibrator making use of in-plane flexural vibrations like a vibration device 21 according to a second embodiment of the present invention illustrated in a perspective view in FIG. 7. The stated vibration device 21 includes a support member 22, and a vibration arm 23 serving as even numbers of vibration bodies. In the present embodiment, two vibration arms 23*a* and 23*b* are provided as vibration bodies.

The vibration arms 23*a* and 23*b* are each formed in an elongate rectangle shape in plan view and have a lengthwise direction side and a width direction side. Each one end of the vibration arms 23*a* and 23*b* is connected, as a fixed end, to the support member 22, and the other end thereof is capable of being displaced as a free end. The two vibration arms 23*a* and 23*b* are extended parallel to each other and have the same length. The vibration arms 23*a* and 23*b* are vibration bodies configured to perform flexural vibration in an in-plane flexural vibration mode when an alternating electric field is applied thereto.

The support member 22 is connected to each shorter side of the vibration arms 23*a* and 23*b*. The support member 22 extends in the width direction of the vibration arms 23*a* and 23*b*. The support member 22 supports the vibration arms 23*a* and 23*b* in a cantilever manner.

Figure 8:
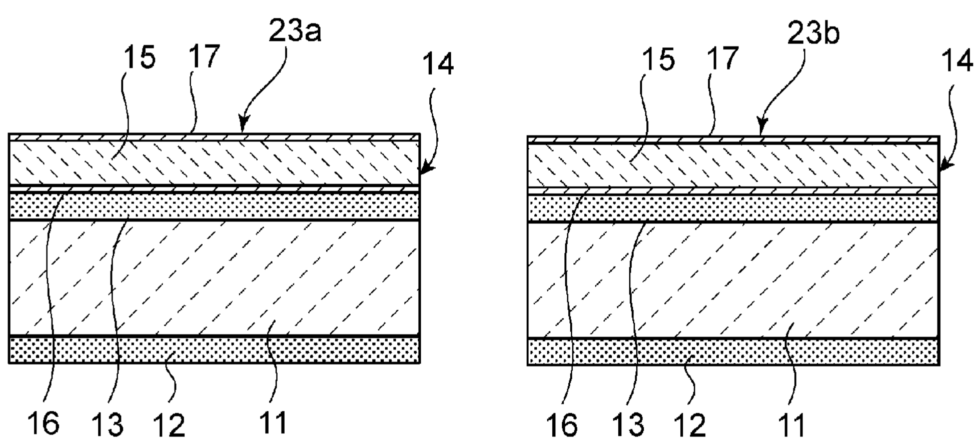
FIG. 8 is a cross-sectional view of a portion taken along a B-B line in FIG. 7.

FIG. 8 is a cross-sectional view of a portion taken along a B-B line in FIG. 7. As shown in FIG. 8, like the vibration device 1 according to the first embodiment, the vibration arms 23*a* and 23*b* are each formed of the $SiO_2$ film (silicon oxide film) 12, the n-type Si layer 11, the $SiO_2$ film 13, and the excitation section 14. The excitation section 14 includes the piezoelectric thin film 15, the first electrode 16, and the second electrode 17. The first electrode 16 and the second electrode 17 are so provided as to sandwich the piezoelectric thin film 15.

Also in the second embodiment, the $SiO_2$ films 12 and 13 are so provided as to be in contact with the upper and lower surfaces of the n-type Si layer 11. This makes it possible to suppress a variation in the resonant frequency due to a change in temperature.

Third Embodiment

In the first and second embodiments, the tuning-fork type vibration devices are described. However, the vibration device may be a resonance vibrator making use of lateral spread vibrations like a vibration device 31 according to a third embodiment illustrated in a perspective view in FIG. 9. The vibration device 31 is a resonator making use of lateral spread vibrations and including support members 32*a* and 32*b*, a vibration plate 33 as a vibration body, and connectors 34*a* and 34*b*.

The vibration plate 33 is formed in a rectangular plate-like shape and has a lengthwise direction side and a width direction side. The vibration plate 33 is connected to the support members 32*a* and 32*b* via the connectors 34*a* and 34*b*, respectively. In other words, the vibration plate 33 is supported by the support members 32*a* and 32*b*. The vibration plate 33 is a vibration body configured to vibrate in the width direction thereof in a lateral spread vibration mode when an alternating electric field is applied thereto.

Each one end of the connectors 34*a* and 34*b* is connected to the center of a side surface on each shorter side of the vibration plate 33. The center of the side surface on each shorter side of the vibration plate 33 serves as a node of the lateral spread vibrations.

The support members 32*a* and 32*b* are connected to the other ends of the connectors 34*a* and 34*b*, respectively. The support members 32*a* and 32*b* extend in both side directions of the connectors 34*a* and 34*b*, respectively. Although lengths of the support members 32*a* and 32*b* are not specifically limiting, the lengths thereof are the same as the length of the shorter side of the vibration plate 33 in the present embodiment.

Figure 9:
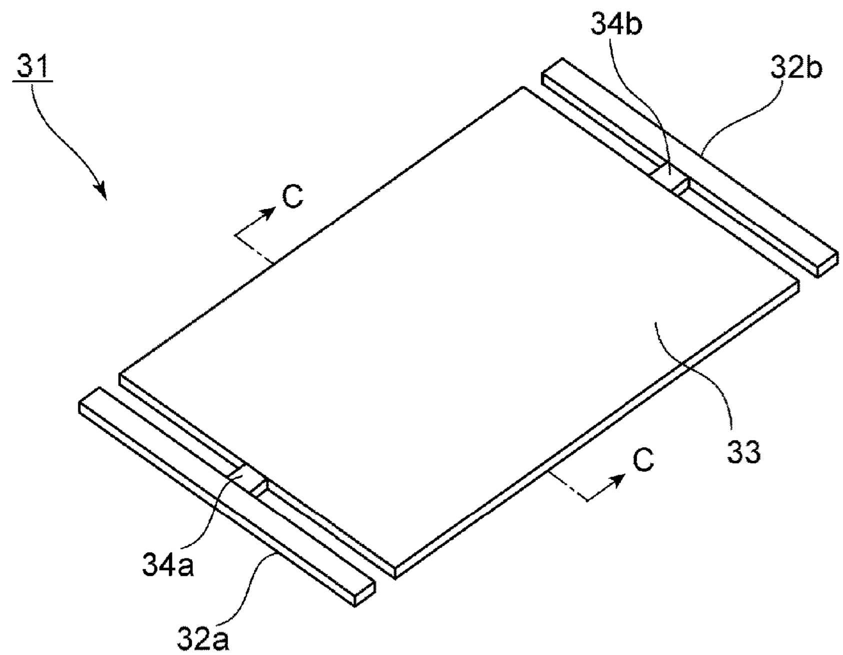
FIG. 9 is a perspective view illustrating an external appearance of a vibration device according to a third embodiment of the present invention.
Figure 10:
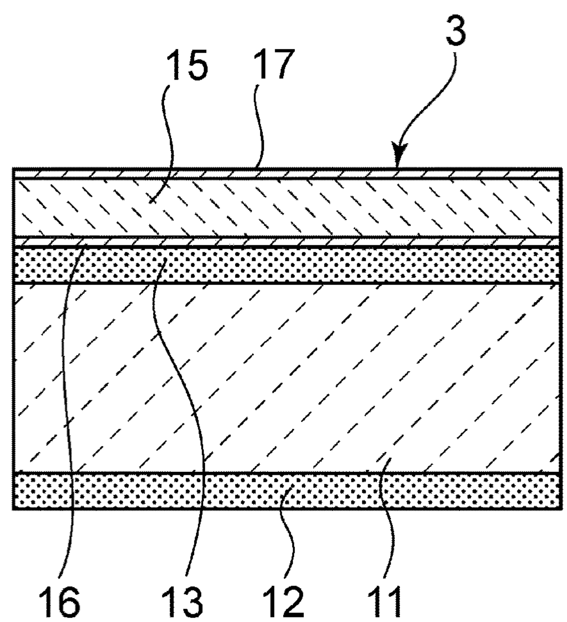
FIG. 10 is a cross-sectional view of a portion taken along a C-C line in FIG. 9.

FIG. 10 is a cross-sectional view of a portion taken along a C-C line in FIG. 9. As shown in FIG. 10, the vibration plate 33 is formed of the silicon oxide film ($SiO_2$ film) 12, the n-type Si layer 11, the $SiO_2$ film 13, the first and second electrodes 16 and 17, and the piezoelectric thin film 15.

To be more specific, the piezoelectric thin film 15 is provided above the n-type Si layer 11. The first and second electrodes 16 and 17 are so provided as to sandwich the piezoelectric thin film 15 therebetween.

Also in the third embodiment, the $SiO_2$ films 12 and 13 are so provided as to be in contact with the upper and lower surfaces of the n-type Si layer 11. This makes it possible to suppress a variation in the resonant frequency due to a change in temperature.

Fourth Embodiment

Figure 11:
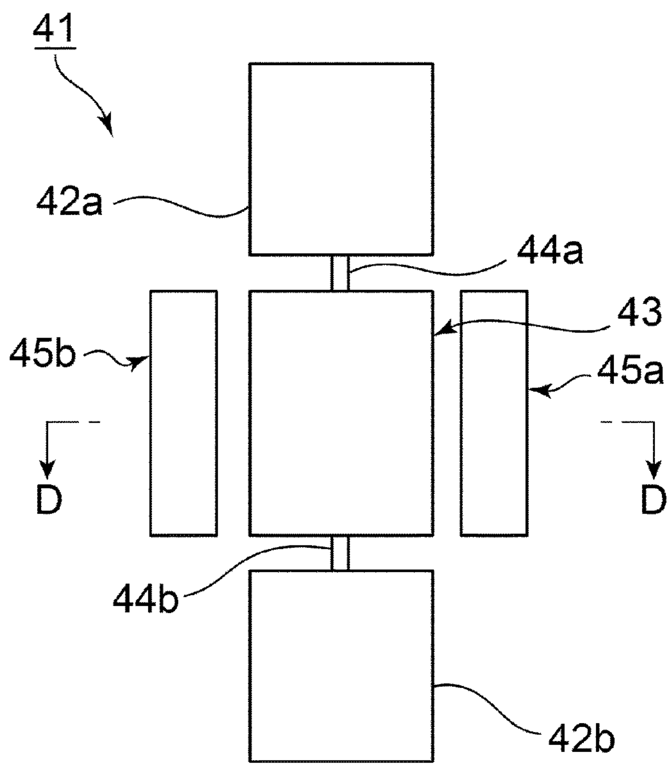
FIG. 11 is a plan view of a vibration device according to a fourth embodiment of the present invention.
Figure 12:
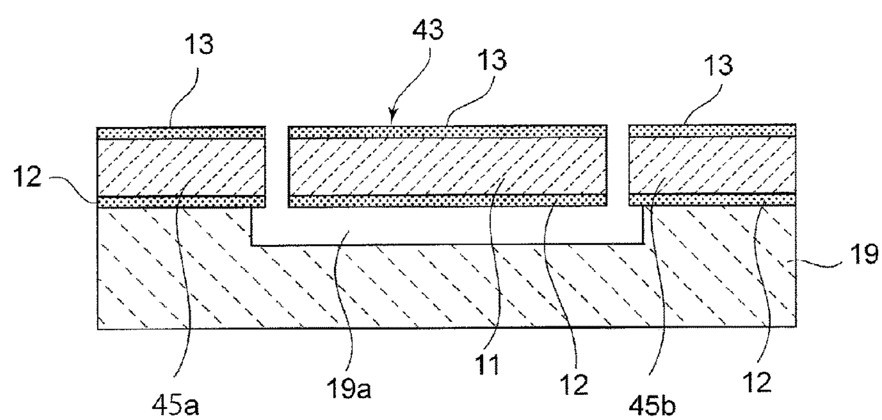
FIG. 12 is a cross-sectional view of a portion taken along a D-D line in FIG. 11.

A vibration device according to the present invention may have an electrostatic MEMS structure. FIG. 11 is a plan view of a vibration device according to a fourth embodiment of the present invention. FIG. 12 is a cross-sectional view of a portion taken along a D-D line in FIG. 11.

A vibration device 41 is a resonance vibrator making use of lateral spread vibrations and including support members 42*a* and 42*b*, a vibration plate 43 as a vibration body, connectors 44*a* and 44*b*, and first and second electrodes 45*a* and 45*b*.

The vibration plate 43 is formed in a rectangular plate-like shape and has a lengthwise direction side and a width direction side. The vibration plate 43 is connected to the support members 42*a* and 42*b* via the connectors 44*a* and 44*b*, respectively. In other words, the vibration plate 43 is supported by the support members 42*a* and 42*b*. The vibration plate 43 is a vibration body configured to vibrate in the width direction thereof in the lateral spread vibration mode when an alternating electric field is applied thereto. The vibration plate 43 is formed of the $SiO_2$ film (silicon oxide film) 12, the n-type Si layer 11, and the $SiO_2$ film 13, as shown in FIG. 12.

Each one end of the connectors 44*a* and 44*b* is connected to the center of a side surface on each shorter side of the vibration plate 43. The center of the side surface on each shorter side of the vibration plate 43 serves as a node of the lateral spread vibrations.

The support members 42*a* and 42*b* are connected to the other ends of the connectors 44*a* and 44*b*, respectively. The support members 42*a* and 42*b* extend in both side directions of the connectors 44*a* and 44*b*, respectively. Although dimensions of the support members 42*a* and 42*b* along the lengthwise direction of the vibration 43 are not specifically limiting, the dimensions thereof are longer than the dimension of the shorter side of the vibration plate 43 in the present embodiment.

The first and second electrodes 45*a* and 45*b* are each formed in a rectangular plate-like shape. The first and second electrodes 45*a* and 45*b* are made of the same material as the n-type Si layer 11. The first and second electrodes 45*a* and 45*b* each oppose the vibration plate 43 with a gap interposed therebetween in the width direction of the vibration plate 43. In other words, each longer side of the first and second electrodes 45*a* and 45*b* on the vibration plated 43 side opposes a longer side of the vibration plate 43.

Further, as shown in FIG. 12, on the upper and lower surfaces of each of the first and second electrodes 45*a* and 45*b*, there are formed the $SiO_2$ film 12 and the $SiO_2$ film 13. Note that, however, the $SiO_2$ films 12, 13 need to be provided on the n-type Si layer 11, but may not be provided on the first and second electrodes 45*a*, 45*b*.

As discussed above, also in the fourth embodiment, the $SiO_2$ films 12 and 13 are so provided as to be in contact with the upper and lower surfaces of the n-type Si layer 11. As such, in the vibration device according to the fourth embodiment, a variation in the resonant frequency due to a change in temperatures is also suppressed.

Figure 13:
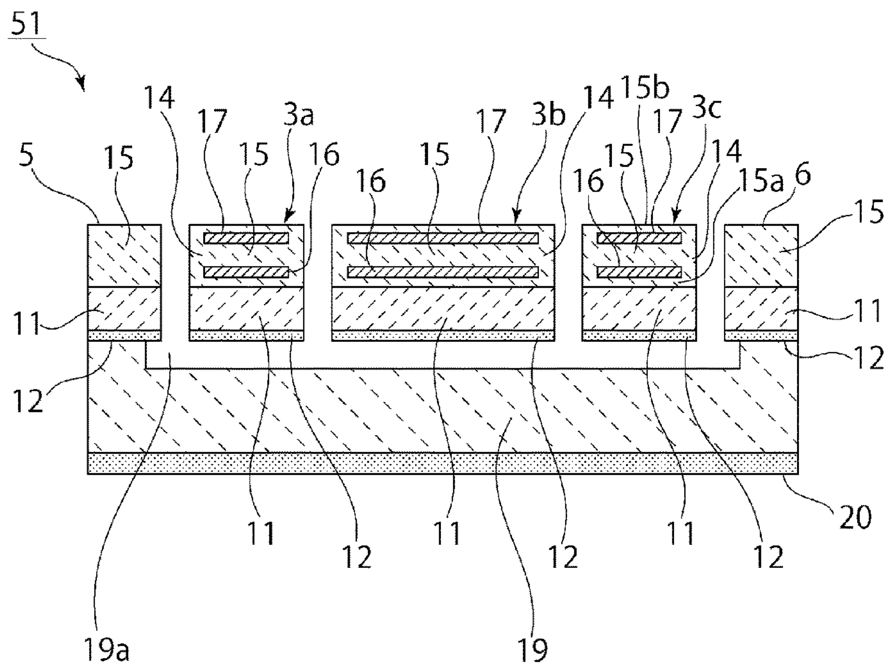
FIG. 13 is a front cross-sectional view of a vibration device according to a fifth embodiment of the present invention.

FIG. 13 is a front cross-sectional view of a vibration device according to a fifth embodiment of the present invention.

A vibration device 51 is different from the vibration device 1 of the first embodiment in a point that the $SiO_2$ film 13 is not provided on the upper surface of the n-type Si layer 11. In the fifth embodiment, a variation in the resonant frequency due to a change in temperature is also suppressed. The reason for this will be described below.

A manufacturing method of the vibration device 51 is the same as that of the vibration device 1 of the first embodiment except that the formation of the $SiO_2$ film 13 shown in FIG. 6(*a*) is not carried out. That is to say, in a state in which the $SiO_2$ films 12 and 13A are provided on the upper and lower surfaces of the n-type Si layer 11, the n-type Si layer 11 is bonded to the Si substrate 19 by thermal bonding. This makes it possible to suppress P doped in the n-type Si layer 11 from scattering to the exterior. As such, since the concentration of P is prevented from being nonuniform within the n-type Si layer 11, a variation in the resonant frequency due to a change in temperature can be suppressed. Further, since the $SiO_2$ film 13 whose thermal conductivity is low is not formed between the piezoelectric thin film 15 and the n-type Si layer 11, thermoelastic loss can be reduced. Accordingly, a resonator with a high Q-value can be formed.

Figure 14:
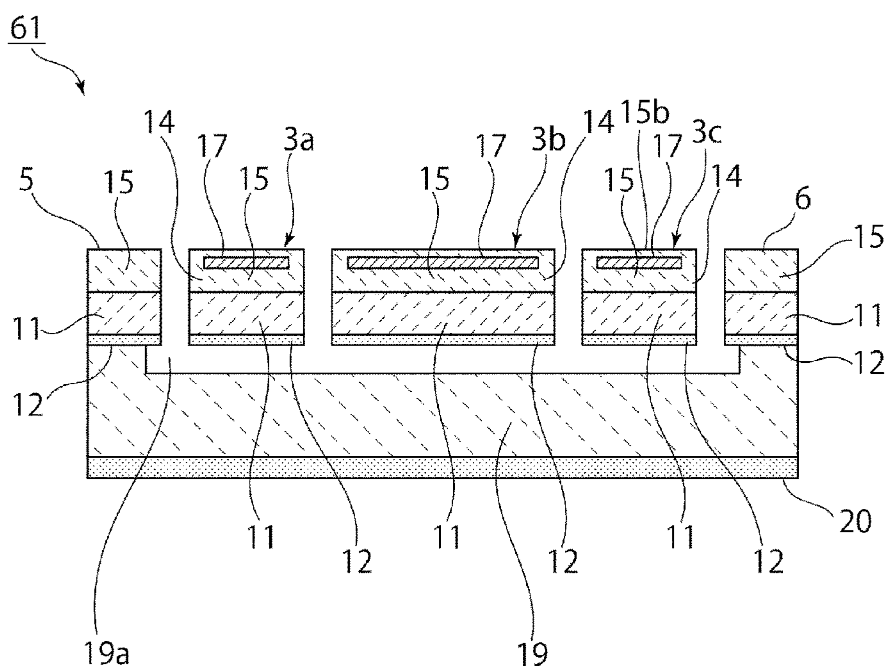
FIG. 14 is a front cross-sectional view of a variation on the vibration device according to the fifth embodiment.

Like a variation on the fifth embodiment illustrated in FIG. 14, a vibration device 61 may not include the first electrode 16. In the case where the $SiO_2$ film 13 is not provided on the upper surface of the n-type Si layer 11, the n-type Si layer 11 can be used as an electrode opposing the second electrode 17 with the piezoelectric thin film 15 sandwiched therebetween. As such, since a process of forming the first electrode 16 can be omitted, productivity can be improved. Further, since the $SiO_2$ film 13 whose thermal conductivity is low is not formed between the piezoelectric thin film 15 and the n-type Si layer 11, the thermoelastic loss can be reduced.

Accordingly, a resonator with a high Q-value can be formed. In addition, by omitting Mo which causes a larger mechanical elastic loss than AlN, Si, or the like, a resonator with a further higher Q-value can be formed.

It is unnecessary for the n-type Si layer 11 to be prepared with a $SiO_2$ film being formed on the surface thereof as shown in FIG. 5(*b*). That is, during the process of bonding the n-type Si layer 11 to the Si substrate 19 by thermal bonding, the bonding is temporarily carried out in the atmosphere, for example. Thereafter, the bonding is again carried out in a high-temperature furnace. When the thermal bonding is carried out in the high-temperature furnace, the $SiO_2$ films 12 and 13A may be formed on the upper and lower surfaces of the n-type Si layer 11 by thermal oxidation. This makes it possible to suppress P doped in the n-type Si layer 11 from scattering to the exterior.

REFERENCE SIGNS LIST

1, 21, 31, 41, 51, 61 VIBRATION DEVICE
2, 22, 32*a*, 32*b*, 42*a*, 42*b* SUPPORT MEMBER
3*a*, 3*b*, 3*c*, 23, 23*a*, 23*b* VIBRATION ARM
4 MASS ADDITION MEMBER
5, 6 SIDE FRAME
11 N-TYPE Si LAYER
12, 12X, 13, 13A $SiO_2$ FILM (SILICON OXIDE FILM)
14 EXCITATION SECTION
15 PIEZOELECTRIC THIN FILM
15*a*, 15*b* PIEZOELECTRIC THIN FILM
16 FIRST ELECTRODE
17 SECOND ELECTRODE
18 MASS ADDITION FILM
19 Si SUBSTRATE
19*a* RECESS
20 $SiO_2$ FILM
33, 43 VIBRATION PLATE
34*a*, 34*b*, 44*a*, 44*b* CONNECTOR
45*a*, 45*b* FIRST ELECTRODE, SECOND ELECTRODE

The invention claimed is:

1. A vibration device comprising:
a support member;
at least one vibration body connected to the support member and including an n-type Si layer which is a degenerate semiconductor;
an electrode positioned to excite the vibration body; and
a first silicon oxide film containing impurities in contact with a first surface of the n-type Si layer.

2. The vibration device according to claim 1, wherein the first surface of the n-type Si layer is opposite to the position of the electrode.

3. The vibration device according to claim 1, further comprising:
a second silicon oxide film that contains impurities in contact with a second surface of the n-type Si layer, the second surface being opposite the first surface.

4. The vibration device according to claim 3, further comprising:
a piezoelectric film,
wherein the electrode includes a first electrode and a second electrode, and
the piezoelectric film is sandwiched between the first electrode and the second electrode such that an excitation section is formed by the piezoelectric film, the first electrode and the second electrode on the n-type Si layer.

5. The vibration device according to claim 1, further comprising:
a piezoelectric film,
wherein the electrode includes a first electrode and a second electrode, and
the piezoelectric film is sandwiched between the first electrode and the second electrode such that an excitation section is formed by the piezoelectric film, the first electrode and the second electrode on the n-type Si layer.

6. The vibration device according to claim 1, further comprising a piezoelectric film, wherein the piezoelectric film is disposed so as to be sandwiched between the electrode and the n-type Si layer.

7. The vibration device according to claim 1, wherein the silicon oxide film is a thermally oxidized silicon oxide film.

8. The vibration device according to claim 1, wherein the impurities are a dopant doped in the n-type Si layer.

9. The vibration device according to claim 8, wherein the n-type Si layer has a doping concentration of no less than $1\times10^{19}/cm^3$.

10. The vibration device according to claim 1, wherein the n-type Si layer has a doping concentration of no less than $1\times10^{19}/cm^3$.

11. The vibration device according to claim 8, wherein the dopant is P.

12. The vibration device according to claim 5, wherein the excitation section is configured so as to cause the vibration body to perform flexural vibration.

13. The vibration device according to claim 1,
wherein the vibration device includes an odd number greater than one of the at least one vibration body, and
the excitation section is configured so as to cause the odd number of vibration bodies to perform out-of-plane flexural vibration.

14. The vibration device according to claim 1,
wherein the vibration device includes an even number of the at least one vibration body, and
the excitation section is configured so as to cause the even number of vibration bodies to perform in-plane flexural vibration.

15. A method of manufacturing a vibration device, the method comprising:
preparing a vibration body that is connected to a support member, the vibration body including an n-type Si layer having opposed first and second surfaces, a first silicon oxide film containing impurities provided on the first surface of the n-type Si layer, and a second silicon oxide film containing impurities provided on the second surface of the n-type Si layer, and
forming an electrode so as to excite the vibration body.

16. The method of manufacturing the vibration device according to claim 15, further comprising:
forming a piezoelectric film,
wherein the electrode comprises first and second electrodes and the piezoelectric film is sandwiched between the first and second electrodes.

17. The method of manufacturing the vibration device according to claim 15, further comprising:

forming a piezoelectric film, wherein the piezoelectric film is sandwiched between the electrode and the n-type Si layer.

18. The method of manufacturing the vibration device according to claim 15, wherein the preparing of the vibration body includes:

preparing a support substrate that is made of Si and has a recess in a surface thereof;

preparing the n-type Si layer; and laminating the n-type Si layer on the support substrate so as to cover the recess of the support substrate.

19. The method of manufacturing the vibration device according to claim 15, wherein the first and second silicon oxide films containing impurities are formed by a thermal oxidation method.

* * * * *